United States Patent [19]

Berringer et al.

[11] Patent Number: 5,103,148
[45] Date of Patent: Apr. 7, 1992

[54] LOW VOLTAGE CIRCUIT TO CONTROL HIGH VOLTAGE TRANSISTOR

[75] Inventors: Kenneth A. Berringer, Phoenix; Robert B. Davies, Tempe, both of Ariz.

[73] Assignee: Motorola, Inc., Schaumburg, Ill.

[21] Appl. No.: 609,540

[22] Filed: Nov. 6, 1990

[51] Int. Cl.⁵ ............................................. H03K 17/08
[52] U.S. Cl. .................................... 318/432; 318/434; 388/903
[58] Field of Search ............... 318/138, 254, 434, 439, 318/432; 361/23, 30, 31; 307/570, 571; 388/903

[56] References Cited

U.S. PATENT DOCUMENTS

| | | | |
|---|---|---|---|
| 3,710,213 | 1/1973 | Hansen . | |
| 4,048,554 | 9/1977 | Stich | 318/138 X |
| 4,453,115 | 6/1984 | Yoshida | 318/434 |
| 4,472,666 | 9/1984 | Akeda et al. | 318/254 |
| 4,481,434 | 11/1984 | Janutka | 307/570 |
| 4,500,802 | 2/1985 | Janutka | 307/571 |
| 4,500,830 | 2/1985 | Gotou et al. | 323/267 |
| 4,575,668 | 3/1986 | Baker | 318/811 |
| 4,633,358 | 12/1986 | Nagano | 318/434 |
| 4,680,513 | 7/1987 | Kennedy | 318/285 |
| 4,885,517 | 12/1989 | Pennock | 318/678 |
| 4,885,517 | 12/1989 | Pennock | 318/678 |
| 4,890,020 | 12/1989 | Bird | 307/571 |
| 4,942,347 | 7/1990 | Ohtani et al. | 318/434 |
| 4,947,091 | 8/1990 | Fukuoka | 318/434 |
| 4,967,336 | 10/1990 | Davies et al. | 363/132 |
| 4,987,352 | 1/1991 | Ishii | 318/254 |
| 4,989,127 | 1/1991 | Wegener | 363/16 |
| 4,989,127 | 1/1991 | Wegener | 363/16 |
| 5,014,179 | 5/1991 | Latos | 363/56 |
| 5,019,955 | 5/1991 | Hoeksma | 363/21 |
| 5,023,539 | 6/1991 | Miller et al. | 322/28 |
| 5,030,897 | 7/1991 | Ohtani et al. | 318/139 |

Primary Examiner—Bentsu Ro
Attorney, Agent, or Firm—Joe E. Barbee

[57] ABSTRACT

A low voltage circuit is used to control a high voltage transistor which operates a high voltage motor. A blocking diode and a bootstrap capacitor are used to shift the voltage of the circuit between two levels. The circuit is enabled by inducing a current flow through an input terminal. The current is amplified and applied to a high voltage transistor. The circuit is disabled by termination of the current flow through the input terminal which causes the circuit to rapidly disable current flow through the high voltage transistor. The circuit also disables current flow through the high voltage transistor during voltage transients to prevent erroneous operation during the transients.

23 Claims, 2 Drawing Sheets

LOW VOLTAGE CIRCUIT TO CONTROL HIGH VOLTAGE TRANSISTOR

BACKGROUND OF THE INVENTION

The present invention relates, in general, to controlling high voltage transistors, and more particularly, to a low voltage circuit for controlling a high voltage transistor that operates a high voltage motor.

Transistor circuits had long been used by the industry for operating electric motors. Of particular interest in recent years, was the use of transistor circuits to operate high voltage, generally in excess of 200 volts, motors. The recent interest had been in not only operating these motors at a constant speed, but also varying the speed of the motor. Generally a pulse width modulation (PWM) technique was used to generate timing signals which were applied to high frequency transistors that operated the motor. This technique of controlling high voltage motors required electronics which had to operate at the high voltages of the motor and had to withstand voltage and current transients resulting from the operation of the motor. Previous methods to control these motors by using PWM signals generally divided the electronics into two electrically isolated sections. One section operated at low voltages(5 volts to 20 volts) and a separate section operated from a voltage approximately equal to the motor voltage. The low voltage section generally contained electronics for developing the PWM timing signals and the high voltage section generally controlled the motor. Since it was difficult and expensive to produce electronics capable of operating at the high voltages of the motor, the electronics in the high voltage section was kept to a minimum. Signals between the two sections were then connected by a device that maintained isolation between the sections such as a transformer or optical coupler. Both optical couplers and transformers limited the switching speed of the PWM signals that were connected between the two sections of electronics. The isolation components alone added additional costs to the circuit, while additional costs were added from isolating the two sections with floating or isolated power supplies. The previous circuits were also difficult to fabricate in an integrated circuit which further increased the cost of the implementations.

Accordingly, it would be desirable to have a low voltage circuit for operating a high voltage motor wherein the circuit can be formed into an a integrated circuit, and the circuit eliminates the need for both separate isolated power supplies and the need for isolation components such as optical couplers and transformers, thereby improving the switching time and lowering the cost of the circuit.

SUMMARY OF THE INVENTION

The objects and advantages of the present invention are achieved by creating a low voltage circuit that controls a high voltage transistor which operates a high voltage motor. A blocking diode and a bootstrap capacitor are used to shift the voltage of the circuit between two levels. The circuit is enabled by inducing a current flow through an input terminal. The current is amplified and applied to a high voltage transistor. The circuit is disabled by termination of the current flow through the input terminal which causes the circuit to rapidly disable current flow through the high voltage transistor. The circuit also disables current flow through the high voltage transistor during voltage transients to prevent erroneous operation during the transients.

DETAILED DESCRIPTION OF THE DRAWINGS

Figure 1:
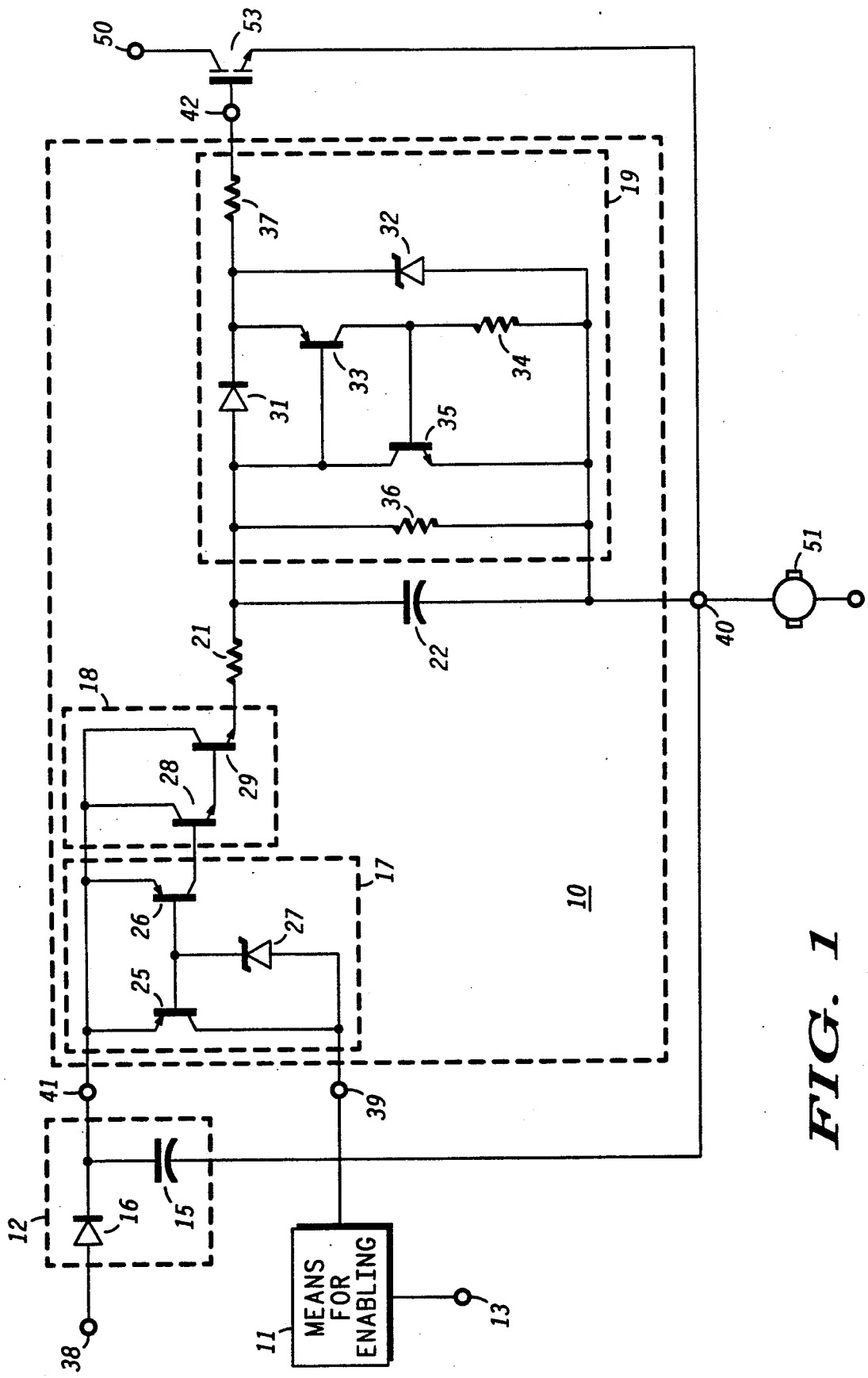
FIG. 1 is a schematic representation of a low voltage circuit that controls a high voltage transistor which operates a high voltage motor in accordance with the present invention.

The present invention provides a low voltage circuit that controls a high voltage transistor which operates a high voltage motor. The high voltage transistor used to drive the motor is generally a power transistor such as an insulated gate bipolar transistor (IGBT) or a power metal oxide semiconductor field effect transistor (power MOSFET). To enable current flow through these type transistors, an input current charges a parasitic gate to emitter capacitance (or gate to source for a MOSFET) of the transistor to a voltage that is equal to or greater than the threshold voltage of the transistor. In a similar manner, turning the transistor off or disabling current flow requires discharging the parasitic input capacitance of the transistor until the voltage on the parasitic input capacitance is below the threshold voltage of the transistor.

The low voltage circuit of the present invention uses a blocking diode and a bootstrap capacitor to shift the circuit from a low voltage to a high voltage that is applied to the high voltage transistor. Only a low voltage is applied across the components in the circuit even after shifting the voltage level. In addition, the bootstrap capacitor supplies operating current to the circuit during the time the voltage level is shifted. This level shifting permits the low voltage circuit to be constructed from low voltage components even though the circuit is connected to a high voltage. The level shifting also allows the circuit to be enabled by low voltage external circuits and permits the integration of the circuit into an integrated circuit with only the blocking diode and the bootstrap capacitor as external components of the integrated circuit. The circuit is activated by a current that flows through an enable input of the circuit. The current is amplified and applied to a control electrode of the high voltage transistor. When the amplified current has charged the parasitic input capacitance to a value equal to the threshold voltage of the high voltage transistor, current begins to flow through the high voltage transistor to operate the motor. When current flow through the enable input is terminated, a turn-off and protection circuit is used to rapidly disable current flow through the transistor. The turnoff and protection circuit also disables current flow through the transistor during voltage transients that result from the operation of the motor, thereby protecting the circuit from erroneous operation during the transients.

While the invention is described with specific preferred embodiments, it is evident that many alternatives and variations will be apparent to those skilled in the semiconductor art. More specifically the invention has been described for controlling a particular insulated gate bipolar transistor (IGBT) structure, although the method is directly applicable to metal oxide semiconductor field effect transistors (MOSFETs), as well as to other transistor structures. Additionally, the invention has been described for operating a particular single phase, and a particular three phase motor configuration although the method is directly applicable to other motor configurations and to high voltage loads other than motors.

Referring to FIG. 1, circuit 10 includes a current mirror 17, an amplifier 18, a resistor 21, a capacitor 22, a turn-off and protection circuit 19, a supply voltage terminal 40, a supply voltage terminal 41, an output terminal 42, and a control input 39. Circuit 12 includes a bootstrap capacitor 15, a blocking diode 16, and a low voltage terminal 38. Blocking diode 16 has an anode connected to low voltage terminal 38, and a cathode connected to supply voltage terminal 41 of circuit 10. Bootstrap capacitor 15 has a first terminal connected to supply voltage terminal 41, and a second terminal connected to supply voltage terminal 40. Current mirror 17 includes a diode connected transistor 25, a transistor 26, and a zener diode 27. Diode connected transistor 25 has an emitter electrode connected to supply voltage terminal 41, a collector electrode connected to control input 39 of circuit 10 and to an anode of zener diode 27, and a base electrode connected to a cathode of zener diode 27. Transistor 26 has a base electrode connected to the base electrode of transistor 25, an emitter electrode connected to supply voltage terminal 41, and a collector electrode connected to a base electrode of a transistor 28. Amplifier 18 includes transistor 28 and a transistor 29 that are connected in a darlington amplifier arrangement. Transistor 28 has a collector electrode connected to supply voltage terminal 41 and to a collector electrode of transistor 29, and an emitter electrode connected to a base electrode of transistor 29. Transistor 29 has an emitter electrode connected to a first terminal of resistor 21. Current mirror 17 and darlington amplifier 18 use a small current flowing through the emitter of transistor 25 to create a larger current that is required to control an external high voltage transistor 53 that forms the load of circuit 10. Means for enabling 11 which induces the current flow through the emitter of transistor 25 is buffered by current mirror 17 and darlington amplifier 18 thereby permitting means for enabling 11 to only induce a small current to flow through transistor 25. Zener diode 27 establishes a minimum voltage that must be applied to terminal 39 in order to enable current flow through transistor 25. The value of the voltage is determined by the zener voltage of diode 27 plus a base to emitter voltage of transistor 25. If transistor 25 were enabled at a lower voltage, transistor 53 would not be enabled in a saturated condition thereby resulting in damage to transistor 53. In the preferred embodiment, diode 27 has a zener voltage between five volts and twelve volts.

Resistor 21 has a second terminal connected to an anode of a diode 31. Capacitor 22 has a first terminal connected to the anode of diode 31, and a second terminal connected to supply voltage terminal 40. Resistor 21 functions as a series limiting resistor and is used to control the amount of current supplied to a control electrode of external transistor 53. Capacitor 22 functions as a filter that removes high frequency noise that the operation of an external motor 51 induces between output terminal 42 and supply voltage terminal 40 of circuit 10. In the preferred embodiment, capacitor 22 has a value of approximately one hundred picofarads.

Turn-off and protection circuit 19 includes a resistor 36, diode 31, a transistor 35, a transistor 33, a zener diode 32, a resistor 34, and a resistor 37. Resistor 36 has a first terminal connected to the anode of diode 31, and a second terminal connected to supply voltage terminal 40. Transistor 35 has a collector electrode connected to the anode of diode 31, an emitter electrode connected to supply voltage terminal 40, and a base electrode connected to a first terminal of resistor 34. A second terminal of resistor 34 is connected to supply voltage terminal 40. Transistor 33 has an emitter electrode connected to a cathode of diode 31, a base electrode connected to the anode of diode 31, and a collector electrode connected to the base of transistor 35. Zener diode 32 has a cathode connected to the cathode of diode 31, and an anode connected to supply voltage terminal 40. Resistor 37 has a first terminal connected to the cathode of diode 31, and a second terminal connected to output terminal 42 of circuit 10. In the preferred embodiment, circuit 10 is integrated on a single semiconductor die and the components of circuit 12 are external components connected to circuit 10. In this preferred embodiment, transistors 25, 26, and 33 are lateral PNP transistors and transistors 28, 29, and 35 are NPN transistors.

In operation, a disable signal is applied to input terminal 13 of means for enabling 11 which disables means for enabling 11 which then disables circuit 10. In this state, capacitor 15 is charged by current flowing from low voltage terminal 38 through blocking diode 16. Capacitor 15 charges to a voltage that is approximately equal to the voltage at terminal 38 minus the voltage drop of diode 16. In the preferred embodiment, the voltage applied to terminal 38 is approximately eighteen volts and capacitor 15 charges to approximately 17.3 volts. Also in this embodiment, capacitor 15 has a value of approximately one microfarad. To enable circuit 10 and cause current flow through external high voltage transistor 53, an enable signal is applied to input 13 of means for enabling 11 which then forces current to flow through the emitter of transistor 25, through control terminal 39, and through means for enabling 11. Means for enabling 11 provides a means for limiting the current flowing through transistor 25. In the preferred embodiment, means for enabling 11 is configured as a current sink which connects terminal 39 through a resistor to ground. Also in this preferred embodiment, the resistor to ground is the means for limiting which sets the value of the current to approximately 100 microamps. The current mirror function provided by current mirror 17 causes a current flow through transistor 26 that is substantially equal to the current flow through transistor 25. The current from transistor 26 is then applied to the base of transistor 28. Transistors 28 and 29 are connected in a darlington amplifier configuration that produces a current at the emitter of transistor 29 that is equal to the current at the base of transistor 28 times the gain of the darlington amplifier. In the preferred embodiment, darlington amplifier 18 has a current gain of approximately 1000, therefore, the maximum current available from the emitter of transistor 29 is approximately 100 milliamps. The current from the emitter of transistor 29 flows through current limiting resistor 21, diode 31, and resistor 37 to output terminal 42 of circuit 10. The current is then applied to the control electrode of external high voltage transistor 53. The current charges a parasitic input capacitance of high voltage transistor 53 raising the voltage on the control electrode of transistor 53 until transistor 53 is enabled and begins conducting. The charging current also charges capacitor 22. The peak value of the charging current applied to the control electrode of transistor 53 is determined by the voltage across capacitor 15 minus the voltage drops of darlington amplifier 18 and diode 31. That value is divided by the combined resistance of resistors 21 plus 37 to obtain the peak charging current. The time required to charge the parasitic capacitance on the input of high voltage transistor 53 is determined by the input capacitance of transistor 53 and the combined resistance of resistors 21 plus 37. Resistor 37 will be used to control the discharge of transistor 53 and is generally much smaller that the value of resistor 21. Consequently, resistor 21 is the primary resistance that determines both the charging current applied to transistor 53 and the time constant of the charging. In the preferred embodiment, resistor 21 has a value of approximately 100 ohms. As high voltage transistor 53 begins conducting, motor supply voltage 50 is applied through transistor 53 to motor 51 and to supply terminal 40 of circuit 10. The bootstrap effect of capacitor 15 causes the value of motor supply voltage 50 to be added to both sides of capacitor 15. The voltage across capacitor 15 does not increase, but the value of motor supply voltage 50 is superimposed on the voltage that was stored on both plates of capacitor 15. Therefore, motor supply voltage 50 is applied to terminal 40 of circuit 10 and a voltage equal to motor supply voltage 50 plus the voltage that was stored on capacitor 15 is applied to terminal 41 of circuit 10. This causes diode 16 to become reversed biased which blocks current flow between the low voltage applied to terminal 38 and the voltage on terminal 41. Since transistor 25 is conducting, the high voltage applied to terminal 41, minus voltage drops from the emitter to base and base to collector voltages of transistor 25, is also applied to terminal 39. Therefore, means for enabling 11 must be capable of operating with these voltages.

Since diode 16 is reversed biased, current required to maintain conduction through high voltage transistor 53 is supplied by capacitor 15. This current slowly discharges capacitor 15 at a time constant that is determined by the value of capacitor 15 and resistor 36. If circuit 10 is enabled for an extended period of time, the current discharges capacitor 15 and the current to the control electrode of high voltage transistor 53 decreases. As the current decreases, high voltage transistor 53, which has been conducting in a saturated condition, enters a linear condition. As transistor 53 begins linear operation, voltage dropped across transistor 53 increases, power dissipation increases, and eventually the transistor is destroyed. Consequently, it is important to maintain a switching rate or enable and disable cycle for circuit 10 that is greater than the discharge time of capacitor 15.

To disable external high voltage transistor 53 and terminate current flow through it, means for enabling 11 terminates the current flow through transistor 25. Current mirror 17 no longer supplies current to darlington amplifier 18 and current is no longer supplied to the input of high voltage transistor 53. Resistor 36 discharges the voltage that was previously stored on capacitor 22 thereby lowering the voltage applied to the base of transistor 33 and enabling current flow through transistor 33. Resistor 36, in combination with capacitor 22, determines the time required to enable transistor 33. In the preferred embodiment, resistor 36 has a value of approximately 15,000 ohms. Diode 31 blocks current from the charged parasitic input capacitance of high voltage transistor 53 from flowing through resistor 36. Therefore, the current from the input capacitance of transistor 53 flows through transistor 33 and enables transistor 35. Transistor 35 then connects the base of transistor 33 to supply voltage terminal 40 and insures that transistor 33 continues to conduct as long as there is a charge stored on the input capacitance of high voltage transistor 53. The latching circuit of transistors 33 and 35 function to rapidly discharge the input capacitance of high voltage transistor 53. The rate of discharge is determined by the input capacitance of high voltage transistor 53 and the value of resistor 37. The value of resistor 37 should be chosen to insure the capacitance of transistor 53 is discharged sufficiently fast to prevent linear operation of transistor 53. In the preferred embodiment, the value of resistor 37 is approximately 10 ohms and the value of the input capacitance of transistor 53 is approximately 4,000 picofarads. When this input capacitance is discharged and can not supply current to transistor 33, transistors 33 and 35 are disabled along with high voltage transistor 53. With high voltage transistor 53 disabled, the high voltage is removed from supply voltage terminal 40, and circuit 10 level shifts back to the voltage applied to low voltage terminal 38. This forward biases blocking diode 16 of circuit 12, and capacitor 15 again charges to the voltage that is applied to supply voltage terminal 41 through diode 16. Circuit 10 is then ready for another enable cycle to be initiated by means for enabling 11.

Figure 2:
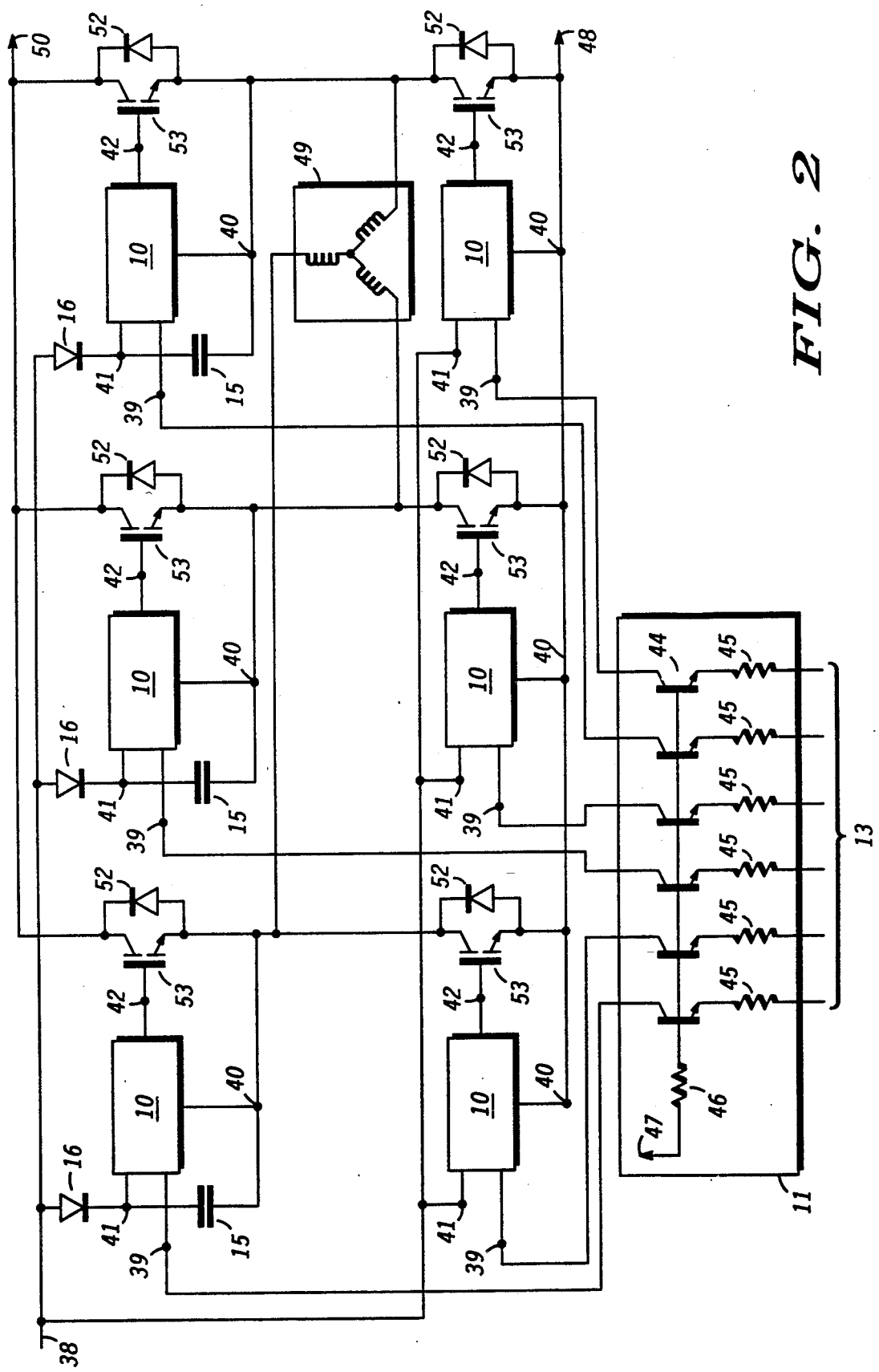
FIG. 2 is a block diagram of a system that uses low voltage circuits to control high voltage transistors that operate a three phase high voltage motor in accordance with the present invention.

Referring to FIG. 2, circuit 10 is shown in a block diagram of a system to control a three phase high voltage motor 49. Elements of the system that were explained in the detailed description of FIG. 1 include circuit 10 which is used six times, blocking diode 16 which is used three times, means for enabling 11, input terminal 13 which is used six times, bootstrap capacitor 15 which is used three times, transistor 53 which is used six times, low voltage terminal 38, and high voltage terminal 50. Also included are a three phase motor 49, diode 52 which is used six times, and a ground terminal 48. For this particular configuration, means for enabling 11 includes resistors 45, transistors 44, resistor 46, and a supply voltage terminal 47. Transistors 44 are six NPN transistors in a common base configuration. Each emitter of transistors 44 functions as an input terminal 13 to means for enabling 11. Input terminals 13 are connected to a means for developing control signals (not shown), such as a PWM timing signal generator, for the system. Resistors 45 are current limiting resistors which limit the current flow through terminal 39 of circuit 10. During the level translation of circuit 10, resistor 46 limits surge currents through a parasitic collector to base capacitance of transistors 44. As described in the detailed description of FIG. 1, means for enabling 11 must operate with the high voltage that is applied to terminal 39 while circuit 10 is level shifted to a high voltage. Some transistors capable of this type operation have a high parasitic collector to base capacitance. For the particular embodiment shown in FIG. 2, it is desirable to use transistors 44 that have a low collector to base capacitance, otherwise additional circuitry may have to be added to compensate for the high parasitic capacitance.

For the particular three phase motor application shown in FIG. 2, a three phase bridge configuration is used to operate the motor. In this three phase bridge configuration, one transistor 53 connected to terminal 50 is conducting current from terminal 50 to a phase of the motor. At the same time, one transistor that is connected to terminal 48 and that does not have a collector connected to the transistor that is conducting current from terminal 50, is conducting current from the motor to ground terminal 48. At some predetermined time, these two transistors are disabled and two other transistors are enabled in a similar manner to conduct current through a different phase of the motor. Also in this application, each transistor 53 is protected, by diode 52, from voltage transients or kickbacks that are created by motor 49. These transients or kickbacks occur when transistors 53 switch current from one phase of motor 49 to a different phase. In this system, three of the circuit 10 elements utilize blocking diode 16 and capacitor 15 while three do not. During the cycles of operating motor 49, the elements of circuit 10 that are connected to blocking diode 16 and to bootstrap capacitor 15 function per the description in the detailed description of FIG. 1. Three of the circuit 10 elements do not have blocking diode 16 or capacitor 15. Supply voltage terminal 40 of these circuit 10 elements is connected to ground terminal 48 of the system. Since these three circuit 10 elements are not connected to a high voltage, blocking diode 16 and capacitor 15 are not required. For these three circuit 10 elements, low voltage terminal 38 supplies current to supply voltage terminal 41 and to transistor 53 instead of the current being supplied from a capacitor. Other operations of these circuit 10 elements function as described in the detailed description of FIG. 1.

During the operation of multiphase motors, voltage transients are induced by the switching of voltages to the inductive load of the motor. These voltage transients could couple to the input of high voltage transistor 53 and erroneously enable transistor 53 to supply current to the motor. Elements of circuit 10 that are shown in FIG. 1 prevent such an occurrence. Turn-off and protection circuit 19, in combination with capacitor 22, provides a low resistance path that suppresses these voltage transients and prevents high voltage transistor 53 from conducting. This is accomplished by enabling transistor 33 during the transient to insure the parasitic input capacitance of transistor 53 remains discharged thereby preventing transistor 53 from supplying current to motor 51. Additionally, zener diode 32 protects transistor 53 from gate to emitter voltages in excess of a predetermined value. In the preferred embodiment, the zener voltage of zener diode 32 is approximately fifteen volts.

By now it should be appreciated that there has been provided a novel way to fabricate a low voltage circuit for controlling a high voltage transistor that operates a high voltage motor. The circuit eliminates the need for isolation components such as optical couplers or transformers thereby reducing the cost and improving the operating frequency of timing signals that are applied to the circuit. Also separate isolated power supplies are not required thereby further reducing the costs. The circuit is flexible and can be used in various motor configurations including multiphase high voltage motors, a high voltage switch for single phase motors, and various other configurations.

We claim:

1. A circuit to control a high voltage transistor that operates a motor comprises:
   a first transistor having a first current carrying electrode coupled to a first supply voltage terminal of the circuit, a second current carrying electrode coupled to a control terminal of the circuit, and a control electrode;
   a first zener diode having a cathode coupled to the control electrode of the first transistor, and an anode coupled to the control terminal of the circuit;
   a second transistor having a first current carrying electrode coupled to the first supply voltage terminal of the circuit, a control electrode coupled to the control electrode of the first transistor, and a second current carrying electrode;
   a third transistor having a control electrode coupled to the second current carrying electrode of the second transistor, a first current carrying electrode coupled to the first supply voltage terminal of the circuit, and a second current carrying electrode;
   a fourth transistor having a control electrode coupled to the second current carrying electrode of the third transistor, a first current carrying electrode coupled to the first supply voltage terminal of the circuit, and a second current carrying electrode;
   a first resistor having a first terminal coupled to the second current carrying electrode of the fourth transistor, and a second terminal;
   a capacitor having a first terminal coupled to the second terminal of the first resistor, and a second terminal coupled to a second supply voltage terminal of the circuit;
   a second resistor having a first terminal coupled to the second terminal of the first resistor, and a second terminal coupled to the second supply voltage terminal of the circuit;
   a fifth transistor having a first current carrying electrode coupled to the second terminal of the first resistor, a second current carrying electrode coupled to the second supply voltage terminal of the circuit, and a control electrode;
   a diode having an anode coupled to the second terminal of the first resistor, and a cathode;
   a sixth transistor having a control electrode coupled to the second terminal of the first resistor, a first current carrying electrode coupled to the cathode of the diode, and a second current carrying electrode;
   a third resistor having a first terminal coupled to the second current carrying electrode of the sixth transistor and to the control electrode of the fifth transistor, and a second terminal coupled to the second supply voltage terminal of the circuit;
   a second zener diode having a cathode coupled to the cathode of the diode, and an anode coupled to the second supply voltage terminal of the circuit; and
   a fourth resistor having a first terminal coupled to the cathode of the diode, and a second terminal coupled to an output of the circuit.

2. The circuit of claim 1 further including the elements of claim 1 integrated on a single semiconductor die.

3. The circuit of claim 1 further including a means for blocking having a first terminal coupled to the first supply voltage terminal of the circuit and a second terminal coupled to a low voltage terminal.

4. The circuit of claim 3 wherein the means for blocking includes a blocking diode having an anode coupled to the low voltage terminal and a cathode coupled to the first supply voltage terminal of the circuit.

5. The circuit of claim 1 further including a means for bootstrapping having a first terminal coupled to the first supply voltage terminal of the circuit and a second terminal coupled to the second supply voltage terminal of the circuit.

6. The circuit of claim 5 wherein the means for bootstrapping is a bootstrap capacitor having a first terminal coupled to the first supply voltage terminal of the circuit and a second terminal coupled to the second supply voltage terminal of the circuit.

7. The circuit of claim 1 wherein the first zener diode has a zener voltage ranging from approximately five volts to approximately twelve volts.

8. The circuit of claim 1 wherein the second zener diode has a zener voltage of approximately fifteen volts.

9. The circuit of claim 1 wherein the first, second, and sixth transistors are PNP transistors.

10. The circuit of claim 1 wherein the third, fourth, and fifth transistors are NPN transistors.

11. The circuit of claim 1 wherein the first resistor has a resistance of approximately one hundred ohms.

12. The circuit of claim 1 wherein the fourth resistor has a resistance of approximately ten ohms.

13. The circuit of claim 1 wherein the second resistor has a resistance of approximately 15,000 ohms.

14. The circuit of claim 1 wherein the capacitor has a value of approximately one hundred picofarads.

15. A low voltage integrated circuit for controlling an external high voltage motor drive transistor which comprises:
   means for establishing a current flow in a first portion of a current mirror in response to a voltage applied to a control input terminal of the low voltage integrated circuit wherein the current flow produces a substantially equal current in a second portion of the current mirror;
   means for amplifying the substantially equal current thereby creating an amplified current;
   means for applying the amplified current to a control electrode of the drive transistor to produce a current flow through the drive transistor and operate a motor coupled to the drive transistor wherein the means for applying establishes a time constant for charging the control electrode; and
   means for disabling the current flow through the drive transistor wherein the amplified current flows through the means for disabling and the means for disabling includes a turn-off and protection circuit that disables current flow through the drive transistor by coupling the control electrode of the drive transistor to a current carrying electrode of the drive transistor in order to discharge a voltage stored on the control electrode of the drive transistor, said means for disabling also disabling current flow through the drive transistor during voltage transients that are applied to the control electrode of the drive transistor.

16. The circuit of claim 15 wherein the means for amplifying the substantially equal current includes an amplifier circuit having an input coupled to the second portion of the current mirror and an output coupled to the means for applying wherein the amplifier circuit amplifies the substantially equal current.

17. The circuit of claim 16 wherein the amplifier circuit includes a Darlington transistor having a control electrode coupled to the second portion of the current mirror, and a current carrying electrode coupled to the means for applying.

18. The circuit of claim 15 wherein the means for applying the amplified current includes the amplified current flowing through at least one resistor to limit the amplified current to a predetermined value.

19. The circuit of claim 15 wherein the means for disabling current flow through the drive transistor further includes a means to protect the input of the drive transistor from excessive voltages.

20. A method of controlling a high voltage motor drive transistor with a low voltage circuit, comprising the steps of:
   storing a predetermined voltage from a low voltage terminal on a means for bootstrapping;
   applying a predetermined current to a control electrode of the high voltage motor drive transistor;
   blocking the low voltage terminal from the circuit;
   supplying current from the means for bootstrapping to a control electrode of the high voltage motor drive transistor;
   terminating current flow to the control electrode of the high voltage motor drive transistor;
   terminating current flow through the high voltage motor drive transistor; and
   preventing current flow through the high voltage motor drive transistor during voltage transients.

21. The method of claim 20 wherein the applying a predetermined current step includes establishing a current to flow in a current mirror by applying a voltage to a control input terminal of the circuit, applying a substantially equal current to a darlington amplifier, amplifying the substantially equal current, limiting the amplified current to a predetermined value, and applying the predetermined current to the control electrode of the high voltage motor drive transistor.

22. The method of claim 20 wherein the terminating current flow through the high voltage motor drive transistor includes enabling a turn-off and protection circuit to couple the control electrode of the high voltage motor drive transistor to a current carrying electrode of the high voltage motor drive transistor which discharges a voltage stored on the control electrode of the high voltage motor drive transistor.

23. The method of claim 20 wherein the preventing current flow step includes enabling a turn off and protection circuit during the voltage transients to couple the control electrode of the high voltage motor drive transistor to the current carrying electrode of the high voltage motor drive transistor which disables current flow through the high voltage motor drive transistor during the transients.

* * * * *